US010938512B2

(12) United States Patent
Ganwani et al.

(10) Patent No.: US 10,938,512 B2
(45) Date of Patent: Mar. 2, 2021

(54) CORRELATION-BASED DETECTION OF ENCODED ADDRESS IN PACKET

(71) Applicant: Marvell World Trade Ltd., St. Michael (BB)

(72) Inventors: Vijay Ganwani, Pune (IN); Ankit Sethi, Pune (IN)

(73) Assignee: Marvell Asia Pte., Ltd., Singapore (SG)

( * ) Notice: Subject to any disclaimer, the term of this patent is extended or adjusted under 35 U.S.C. 154(b) by 37 days.

(21) Appl. No.: 16/359,968

(22) Filed: Mar. 20, 2019

(65) Prior Publication Data

US 2019/0296858 A1    Sep. 26, 2019

Related U.S. Application Data

(60) Provisional application No. 62/646,801, filed on Mar. 22, 2018.

(51) Int. Cl.
| | |
|---|---|
| *H04L 1/00* | (2006.01) |
| *H03M 13/23* | (2006.01) |
| *H03M 13/00* | (2006.01) |
| *H04L 29/06* | (2006.01) |

(52) U.S. Cl.
CPC ........ *H04L 1/0045* (2013.01); *H03M 13/235* (2013.01); *H04L 69/22* (2013.01)

(58) Field of Classification Search
None
See application file for complete search history.

(56) References Cited

U.S. PATENT DOCUMENTS

2017/0187487 A1* 6/2017 Wang .................... H04L 1/0061
2017/0238328 A1* 8/2017 Luong ................... H04L 43/16
370/329

OTHER PUBLICATIONS

Specification of the Bluetooth System, Version 2.0: vol. 0, "Master Table of Contents & Compliance Requirements," pp. 1-74; vol. 1, "Architecture & Terminology Overview," pp. 1-92; vol. 2, "Core System Package [Controller Volume]", pp. 1-814; vol. 4, "Core System Package [Host Volume]," pp. 1-250, (Nov. 4, 2004).

* cited by examiner

*Primary Examiner* — Justin R Knapp

(57) ABSTRACT

A receiver device generates a bit stream corresponding to a received signal at least by demodulating the received signal. The received signal includes an address that was encoded at a transmitter device using a forward error correction code. The receiver device correlates the bit stream with an encoded known address to generate a correlation output that indicates a degree of similarity between a segment of the bit stream and the encoded known address. The encoded known address corresponds to a known device address that was encoded using the error correction code. The receiver device determines when the correlation output is greater than a threshold that corresponds to a particular degree of similarity with the encoded known address. The receiver device determines that the bit stream includes the known device address when the receiver device determines that the correlation output is greater than the threshold.

20 Claims, 5 Drawing Sheets

CORRELATION-BASED DETECTION OF ENCODED ADDRESS IN PACKET

CROSS REFERENCES TO RELATED APPLICATIONS

This application claims the benefit of U.S. Provisional Patent App. No. 62/646,801, entitled "Access Code and Rate Detection for BLE Long Range," filed on Mar. 22, 2018, the disclosure of which is hereby expressly incorporated herein by reference in its entirety.

FIELD OF TECHNOLOGY

The present disclosure relates generally to wireless communication systems, and more particularly to detecting fields in headers of packets.

BACKGROUND

Bluetooth Low Energy ("Bluetooth LE" or "BLE") is a wireless personal area network communication protocol designed for use with small, battery-powered devices such as BLE beacons, wearable electronics, Internet of Things (IoT) sensors, etc. BLE provides for a fixed 1 megabits per second (Mbs) data rate and is suitable for relatively short range communications.

BLE Long Range ("BLR") is a newer generation of BLE communication protocol. BLR provides for data rates of 125 kilobits per second (kbps) and 500 kbps. Additionally, BLR provides an option to user forward error correction (FEC) to increase range as compared to BLE.

BLR packets include a header having an address field and a rate field that indicates a data rate at which a payload of the packet was transmitted. The address field and the rate field are encoded using a forward error correction (FEC) encoder. Typically, a receiver determines whether an address value in the address field of a packet corresponds to the receiver 300 by decoding the address field using an FEC decoder and then comparing FEC-decoded bits of the address field with an address of the receiver. Similarly, the receiver typically determines a data rate at which the payload of the packet was transmitted by decoding the rate field using the FEC decoder and then analyzing the EEC-decoded bits of the rate field.

SUMMARY

In an embodiment, a method is for processing a received signal corresponding to a packet, the received signal having been transmitted by a transmitter device, wherein the packet includes an address field having an address, and wherein the address has been encoded at the transmitter device using a forward error correction code. The method includes: generating, at a receiver device, a bit stream corresponding to the received signal at least by demodulating the received signal; correlating, at the receiver device, the bit stream with an encoded known address to generate a correlation output that indicates a degree of similarity between a segment of the bit stream and the encoded known address, wherein the encoded known address corresponds to a known device address that was encoded using the error correction code; determining, at the receiver device, when the correlation output is greater than a threshold, wherein the threshold corresponds to a particular degree of similarity with the encoded known address; and determining, at the receiver device, that the bit stream includes the known device address when the receiver device determines that the correlation output is greater than the threshold.

In another embodiment, a communication device comprises: receiver circuitry configured to generate a bit stream corresponding to a received signal, the received signal having been transmitted by a transmitter device, wherein the circuitry includes a demodulator configured to demodulate the received signal, wherein the received signal corresponds to a packet, wherein the packet includes an address field having an address, and wherein the address has been encoded at the transmitter device using a forward error correction code; address detection circuitry that is configured to determine whether the bit stream includes a known device address, wherein the address detection circuitry comprises: a correlator configured to correlate the bit stream with an encoded known address to generate a correlation output that indicates a degree of similarity between a segment of the bit stream and the encoded known address, wherein the encoded known address corresponds to the known device address having been encoded using the error correction code, and a comparator; wherein the comparator is configured to: determine when the correlation output is greater than a threshold, wherein the threshold corresponds to a particular degree of similarity with the encoded known address, and generate a signal that indicates that the bit stream includes the known device address when the correlation output is determined to be greater than the threshold.

In yet another embodiment, a method is for processing a received signal corresponding to a packet, the received signal having been transmitted by a transmitter device, wherein the packet includes a rate indicator field to indicate a data rate at which a payload of the packet was transmitted, and wherein the rate indicator field has been encoded at the transmitter device using a forward error correction code. The method includes: generating, at a receiver device, a bit stream corresponding to the received signal at least by demodulating the received signal; correlating, at the receiver device, the bit stream with a plurality of encoded permissible data rate values to generate a plurality of correlation outputs, wherein each correlation output indicates a degree of similarity between a segment of the bit stream and a respective encoded permissible data rate value, wherein each encoded permissible data rate value corresponds to a respective permissible data rate value that was encoded using the error correction code, and wherein each permissible data rate value corresponds to a respective data rate; determining, at the receiver device, a maximum correlation value from among the plurality of correlation outputs; determining, at the receiver device, that the bit stream includes a particular permissible data rate value that corresponds to the maximum correlation value from among the plurality of correlation outputs; and in response to determining that the bit stream includes the particular permissible data rate value, processing a payload of the packet according to a particular data rate that corresponds to the particular permissible data rate value.

In still another embodiment, an apparatus comprises: receiver circuitry configured to generate a bit stream corresponding to a received signal, the received signal having been transmitted by a transmitter device, wherein the circuitry includes a demodulator configured to demodulate the received signal, wherein the received signal corresponds to a packet, wherein the packet includes a rate indicator field to indicate a data rate at which a payload of the packet was transmitted, and wherein the rate indicator field has been encoded at the transmitter device using a forward error correction code; rate detection circuitry that is configured to determine whether the bit stream includes a permissible data rate value, wherein the permissible data rate value corresponds to a particular data rate, and wherein the address detection circuitry comprises: a plurality of correlators configured to correlate the bit stream with a plurality of encoded permissible data rate values to generate a plurality of correlation outputs, wherein each correlation output indicates a respective degree of similarity between a segment of the bit stream and a respective encoded permissible data rate value, wherein each encoded permissible data rate value corresponds to a respective permissible data rate value that was encoded using the forward error correction code, and a maximum value detector configured to: determine a maximum correlation value from among the plurality of correlation outputs and generate a signal that indicates that the bit stream includes a particular permissible rate that corresponds to the maximum correlation value; and digital processing circuitry configured to process the payload of the packet according to the particular permissible data rate in response to the signal that indicates that the bit stream includes the particular permissible rate.

DETAILED DESCRIPTION

Figure 1:
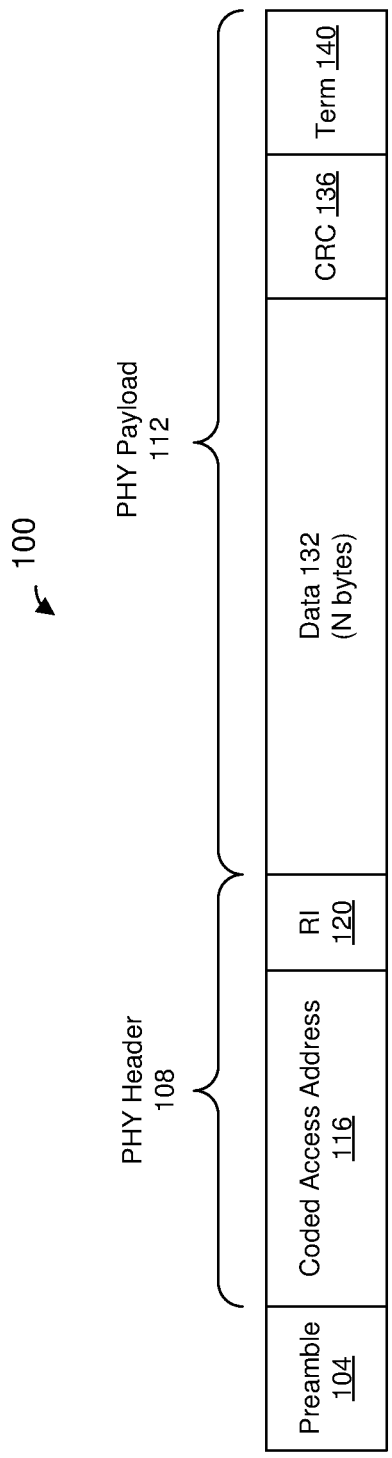
FIG. 1 is a diagram of an example BLR packet transmitted by the transmitter of FIG. 1, according to an embodiment.

When an address field in a packet has been encoded using a forward error correction (FEC) encoder, prior art receivers determine whether an address value in the address field of a packet is equal to an address of the receiver by decoding the address field using an FEC decoder and then comparing FEC-decoded bits of the address field with the address of the receiver. With such an approach, there is a processing delay of the FEC decoder, and thus with this straightforward approach the receiver cannot determine whether the packet is addressed to the receiver until the FEC decoder has finished processing the address field.

Similarly, when a rate field (which indicates a data rate at which a payload has been transmitted) in a packet has been encoded using an FEC encoder, the prior art receiver determines a data rate at which the payload of the packet was transmitted by decoding the rate field using the FEC decoder and then analyzing the FEC-decoded bits of the rate field. With such an approach, there is a processing delay of the FEC decoder, and thus with this straightforward approach the receiver cannot determine the rate at which the payload was transmitted until the FEC decoder has finished processing the rate field.

In embodiments described below, a receiver includes a correlation-based value detector that processes an address field and/or a rate field in a packet without first decoding the address field and/or the rate field with an FEC decoder. In at least some embodiments, the correlation-based value detector determines whether the address value in the address field corresponds to the receiver more quickly as compared to the straightforward approach described above. In at least some embodiments, because the correlation-based value detector more quickly determines whether the address value in the address field corresponds to the receiver, the receiver 300 (or at least some components thereof) is able to go into a low power mode more quickly when the packet is not intended for the receiver as compared to a prior art receiver. In some embodiments, because the FEC decoder of the receiver is not needed for determining whether the address value in the address field corresponds to the receiver, the FEC decoder can be kept in a low power mode until the correlation-based value detector determines that the address value in the address field of the packet corresponds to the receiver, thus saving power as compared to a prior art receiver.

In an embodiment, the FEC encoder at the transmitter maps different uncoiled receiver addresses to different values of encoded addresses that are separated by a minimum Hamming distance corresponding to the FEC implemented by the FEC encoder. The Hamming distance between two codewords is the number of positions at which corresponding bits are different. Because of different encoded addresses are separated by at least the minimum Hamming distance, the correlation-based value detector is able to detect the encoded address of the receiver even though a received signal not exactly match the encoded address, for example, due to errors introduced as a result of noise, interference, etc., according to an embodiment. Additionally, because different encoded addresses are separated by at least the minimum Hamming distance, there is a suitably low probability that correlation-based value detector will mistakenly determine that the received signal includes the encoded address when the received signal in fact includes an encoded address of another receiver, according to an embodiment.

In at least some embodiments, the correlation-based value detector determines a data rate indicated by a rate field in the packet more quickly as compared to the straightforward approach described above. In at least some embodiments, because the correlation-based value detector more quickly determines the data rate indicated by the rate field in the packet, less buffering of signal data is required and thus a size of a memory (not shown) for buffering the signal data can be reduced as compared to the straightforward approach.

In an embodiment, the FEC encoder at the transmitter maps different encoded data rate values to different values of encoded data rate values that are separated by the minimum Hamming distance corresponding to the FEC implemented by the FEC encoder. Because different encoded data rate values are separated by at least the minimum Hamming distance, the correlation-based value detector is able to detect a particular encoded data rate value even though a received signal not exactly match the particular encoded data rate value, for example, due to errors introduced as a result of noise, interference, etc., according to an embodiment. Additionally, because different encoded addresses are separated by at least the minimum Hamming distance, there is a suitably low probability that correlation-based value detector will mistakenly determine that the received signal includes a particular encoded data rate value when the received signal in fact includes a different encoded data rate value, according to an embodiment, Techniques for correlation-based detection of one or more values in a packet are described in the context of communication devices that operate according to the Bluetooth Low Energy (BLE) Long Range ("BLR") protocol. In other embodiments, however, techniques for detecting one or more values in a packet are utilized with communication devices that operate according to other communication protocols, such as a personal area network (PAN) protocol, a wireless local area network (WLAN) protocol, a mobile communication network protocol, a metropolitan area network (MAN) protocol, a satellite communication network protocol, etc.

FIG. 1 is a diagram of a packet 100 communicated by devices that operate according to the BLR protocol, according to an embodiment. The packet 100 includes a preamble 104, a PHY header 108, and a PHY payload 112. The PHY header includes a coded access address field 116 and a rate indicator (RI) field 120. The coded access address field 116 includes an address of an intended receiver of the packet 100 that has been encoded using a forward error correction (FEC) encoder at a transmitter.

The RI field 120 includes a rate value (which has been encoded using the FEC) that indicates a data rate at which the PHY payload 112 is transmitted. For example, the BLR protocol defines a plurality of data rates, including a first data rate (125 kilobits per second (kbps)) and a second data rate (500 kbps). The first data rate (125 kbps) corresponds to a first BLR transmission mode discussed in more detail below, and the second data rate (500 kbps) corresponds to a second BLR transmission mode discussed in more detail below.

The PHY payload 112 includes a data field 132, a cyclic redundancy check (CRC) field 136, and a termination field 140. The CRC field 136 includes an error detection value generated using data in the data field 132. The CRC field 136 includes an error detection value generated using data in the data field 132. The PHY payload 112 is transmitted at either a data rate of 125 kbps or a data rate of 500 kbps.

Figure 2:
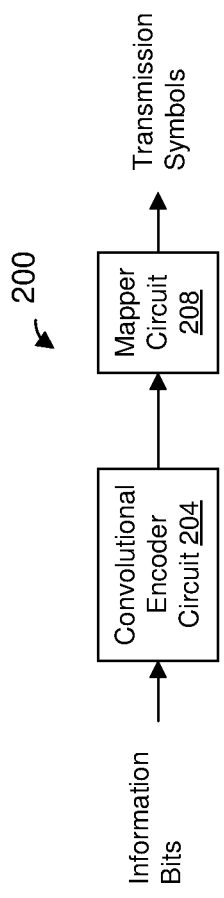
FIG. 2 is a block diagram of an example encoding portion of an example Bluetooth Low Energy (BLE) Long Range (BLR) transmitter, according to an embodiment.

FIG. 2 is a diagram of an encoding portion 200 of an example BLR transmitter that is configured to generate and transmit the packet 100 of FIG. 1, according to an embodiment. FIG. 2 is described with reference to FIG. 1 for explanatory purposes. A convolutional encoder circuit 204 (e.g., a binary convolutional code (BCC) encoder) is configured to encode the PHY header 108 and the data according to a forward error correction (FEC) code to generate an encoded bit stream corresponding to the packet. An FEC encoder, such as the convolutional encoder 204, generates redundancy information (sometimes referred to herein as "parity bits") that enable a decoder at a receiver to correct errors in the packet that were introduced by noise, interference, etc., as a result transmission of the packet through a communication medium.

A mapper circuit 208 maps each bit of the encoded bit stream to a respective bit pattern among a plurality of bit patterns, and an output of the mapper circuit 208 is a sequence of bit patterns (sometimes referred to as "transmission symbols"). For example, the BLR protocol defines a first transmission mode in which each zero in the encoded bit stream is mapped to a first bit pattern, 0011, and each one in the encoded bit stream is mapped to a second bit pattern, 1100. The BLR protocol also defines a second transmission mode in which the mapper circuit 208 is bypassed, or in which each zero in the encoded bit stream is mapped to zero, and each one in the encoded bit stream is mapped to one. In the second transmission mode, each bit in the output of the mapper circuit 208 (or if the mapper circuit 208 is bypassed, each bit in the output of the convolutional encoder circuit 204) is considered a respective bit pattern in the sequence of bit patterns.

Referring now to FIGS. 1 and 2, the PHY header 108 is encoded by the convolutional encoder circuit 204 and transmitted at data rate of 125 kbps. The address of the intended receiver comprises 32 uncoded bits. The encoded address value (after encoding by the convolutional encoder circuit 204) comprises 64-bits. Thus, the coded access address field 116 includes 64 bits, according to an embodiment. In an embodiment, the rate value comprises 5 uncoded bits, and the encoded rate value (after encoding by the convolutional encoder circuit 204) comprises 10 bits. Thus, the RI field 120 includes 10 bits, according to an embodiment.

Each encoded bit in the coded access address field 116 and the RI field 120 is mapped to a corresponding bit pattern by the mapper circuit 208 (FIG. 1).

In an embodiment, the termination field 140 includes bit values that have the effect of resetting the convolutional encoder circuit 204.

As discussed above, the PHY header 108 and the PHY payload 112 are encoded by the convolutional encoder circuit 204. The PHY header 108 is encoded as a first FEC block, and the PHY payload 112 is encoded as a second FEC block. For instance, once the PHY header 108 has been encoded and prior to encoding the PHY payload 112, the convolutional encoder circuit 204 is reset. For example, the PHY header 108 includes a termination field (not shown) after the RI field 120 which has the effect of resetting the convolutional encoder circuit 204 before the convolutional encoder circuit 204 begins encoding the PRY payload 112.

Figure 3:
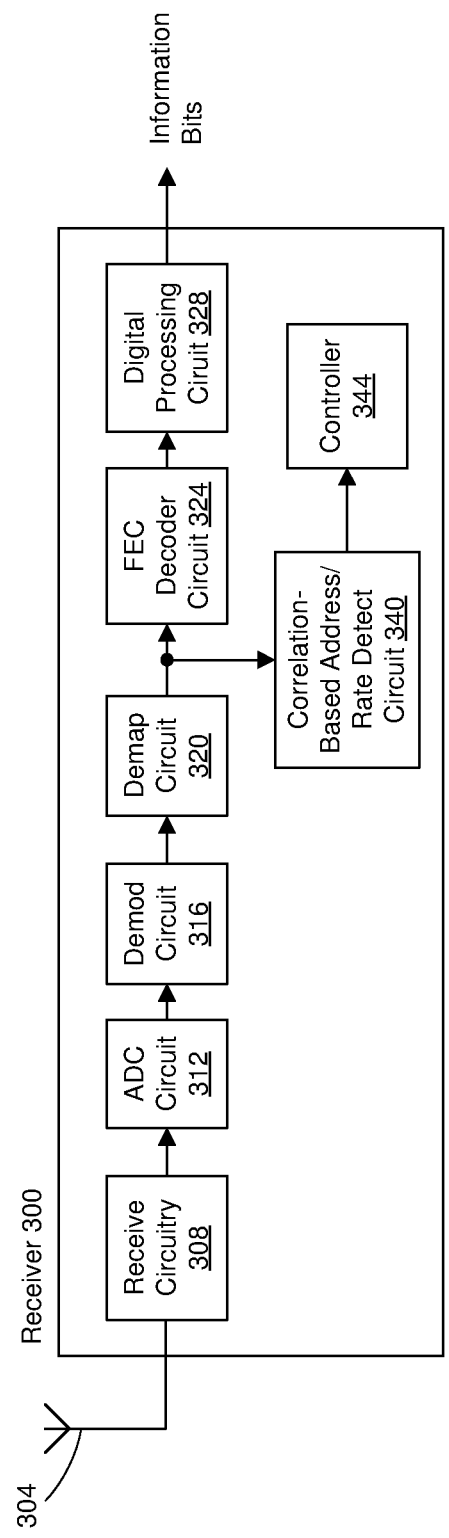
FIG. 3 is a block diagram of an example receiver that is configured to detect an encoded value in a received packet using a correlation-based value detector, according to an embodiment.

FIG. 3 is a diagram of an example receiver 300 that is configured to detect one or more values in a packet using a correlation-based technique, according to an embodiment. The receiver 300 is included in a battery-powered device such as a BLE beacon, a wearable electronic device, a sensor (e.g., an Internet of Things (IoT) sensor), etc., according to some embodiments. The receiver 300 is included in a computer device such as a desktop computer, a laptop computer, a tablet, a smartphone, etc., according to other embodiments. The receiver 300 is configured to be coupled to another device (e.g., a battery-powered device, a computer device, etc.) via a communication link (e.g., a USB port, a Lightning port, etc.), according to other embodiments.

In some embodiments, the receiver 300 is configured to process packets having a format the same as or similar to the packet 100 of FIG. 1. For example, the receiver 300 is configured to determine if the coded access address field 116 (FIG. 1) includes an address value corresponding to the receiver 300. Additionally or alternatively, the receiver 300 is configured to determine which rate value, from among a set of permissible rate values, is included in the rate indicator field 120 (FIG. 1); in an embodiment, the receiver 300 determines a data rate at which the PHY payload 112 of the packet 100 was transmitted using the determined rate value.

In other embodiments, the receiver 300 is configured to process packets having another suitable format different than the packet 100 of FIG. 1.

The receiver 300 includes, or is coupled to, one or more antennas 304 (hereinafter referred to as "the antenna 304" for ease of explanation). Receiver circuitry 308 is coupled to the antenna 304. The receiver circuitry 308 is configured to convert a radio frequency (RF) signal, received via the antenna 304, to an analog baseband signal. The receiver circuitry 308 includes, for example, one or more of i) an amplifier (e.g., a low noise amplifier (LNA), ii) one or more analog filter circuits, iii) a mixer circuit configured to downconvert the RF signal to the baseband signal or an intermediate frequency (IF), etc.

An analog-to-digital converter (ADC) circuit 312 receives the analog baseband signal and converts the analog baseband signal to a digital baseband signal. In an embodiment, the digital baseband signal includes transmission symbols, and a demodulator circuit 316 converts each transmission symbol to a set of one or more bits. In an embodiment, the demodulator circuit 316 is a Gaussian frequency shift keying (GFSK) demodulator, and respective transmission frequencies correspond to respective different sets of bit values. For example, as discussed above, in the first transmission mode of the BLR protocol, each transmission symbol corresponds to either a first bit pattern (e.g., 0011) or a second bit pattern (e.g., 1100); and in the second transmission mode each transmission symbol corresponds to either 0 or 1, i.e., each transmission symbol corresponds to either a first bit value (e.g., 0) or a second bit value (e.g., 1). In an embodiment, the demodulator circuit 316 is configurable to operate differently as described above depending on the transmission mode that was utilized for a packet.

In embodiments in which the transmitter utilizes a suitable modulation other than GFSK, such as binary phase shift keying (BPSK), quadrature amplitude modulation (QAM), etc., the demodulator circuit 316 is a suitable demodulator other than a GFSK demodulator, such as a BPSK demodulator, a QANI demodulator, etc.

A demapper circuit 320 maps each bit pattern output from the demodulator 16 to a single bit value to generate a coded bit stream, according to an embodiment. For example, in the first transmission mode of the BLR protocol described above, the first bit pattern (e.g., 0011) is mapped to 1, and the second bit pattern (e.g., 1100) is mapped to 0, or vice versa. As another example, in the second transmission mode defined by the BLR protocol, the first bit value (e.g., 1) is mapped to 1, and the second bit value (e.g., 0) is mapped to 0, or vice versa. In some embodiments, the demapper circuit 320 is configurable to operate differently than as described above depending on the transmission mode that was utilized for a packet. In some embodiments, the demapper circuit 320 is bypassed when the second transmission mode is utilized. In some embodiments in which the transmitter does not include a mapper such as the mapper 112 (FIG. 1), the demapper circuit 320 is omitted.

An FEC decoder circuit 324 decodes the coded bit stream to generate a decoded bit stream. In an embodiment, the FEC decoder circuit 324 comprises a Viterbi decoder circuit that is configured to implement the Viterbi algorithm. In other embodiments, the FEC decoder circuit 324 comprises another suitable decoder, such as a Sequential Decoder. In other embodiments, in which an FEC encoder at the transmitter is not a convolutional encoder, the FEC decoder circuit 324 comprises a suitable decoder such as a low density parity check (LDPC) decoder, a Reed-Solomon decoder, a turbo code decoder, etc.

A digital processing circuity 328 processes the uncoded bit stream to generate an information bit stream that comprises bits from the data field 132. For example, the digital processing circuity 328 is configured to calculate a CRC of the data field 132 (FIG. 1) and compare the generated CRC value with a transmitted CRC in the CRC field 136, according to an embodiment. As another example in which the transmitter encrypts data in the data field 132, the digital processing circuity 328 is configured to decrypt data in the data field 132. In an embodiment, the digital processing circuity 328 includes a processor configured to execute machine readable instructions stored in a memory (not shown).

Referring now to FIGS. 2 and 3, the receiver 300 processes the coded access address field 116 to determine whether an address value in the coded access address field 116 corresponds to the receiver 300. When the coded access address field 116 includes an address value that corresponds to the receiver 300, the receiver 300 continues processing the PRY payload 112. On the other hand, when the coded access address field 116 does not include an address value that corresponds to the receiver 300, the receiver 300 stops processing the packet 100, at least in some embodiments. In an embodiment, when the coded access address field 116 does not include an address value that corresponds to the receiver 300, the receiver 300 transitions some components of the receiver 300 into a low power mode of operation.

In one embodiment, when the coded access address field 116 does not include an address value that corresponds to the receiver 300, the receiver 300 stops processing the packet 100 after determining (e.g., in a medium access control (MAC) header in the data field 132) a duration of the packet 100; then, the receiver 300 transitions (or some components of the receiver 300 transition) to a low power mode of operation until transmission of the packet 100 has ended.

The PHY payload 112 can be transmitted at different data rates (at least in some embodiments), and thus the receiver 300 (e.g., one or more of the demodulator circuit 316, the demapper circuit 320, etc.) processes the rate indicator field 120 to determine a data rate of the PHY payload 112 so that the receiver 300 can properly process the PHY payload 112. For instance, the demodulator circuit 316 processes the output of the ADC circuit 312 differently depending on the data rate of the PHY payload 112, according to an embodiment. As another example, the demapper circuit 320 processes the output of the demodulator circuit 316 differently depending on the data rate of the PHY payload 112, according to an embodiment. There will be a processing delay for processing the rate indicator field 120 during which the receiver begins receiving the PHY payload 112, and thus an output of the ADC circuit 312 (sometimes referred to as "signal data") is buffered (e.g., stored in a memory (not shown)) until the receiver has completed processing of the rate indicator field 120 and determines the data rate of the PHY payload 112. Once the receiver 300 has determined the data rate of the PHY payload 112, the buffered signal data is processed (as described above) and the remainder of the PHY payload 112 is processed (as described above) as the remainder of the PHY payload 112 is received.

A straightforward approach to determining whether an address value in the coded access address field 116 corresponds to the receiver 300 is to decode the coded access address field 116 using the FEC decoder circuit 324 and then compare the decoded bits of the coded access address field 116 with the address of the receiver 300. There is a processing delay of the FEC decoder circuit 324, and thus with this straightforward approach the receiver 300 cannot determine whether the packet 100 is addressed to the receiver until the FEC decoder circuit 324 has finished processing the coded access address field 116.

Similarly, a straightforward approach to determining a data rate at which the PHY payload 112 was transmitted is to decode the rate indicator field 120 using the FEC decoder circuit 324 and then analyze the decoded bits of the rate indicator field 120. With this straightforward approach the receiver 300 cannot determine the data rate at which the PHY payload 112 was transmitted until the FEC decoder circuit 324 has finished processing the rate indicator field 120.

As opposed to the straightforward approaches described above, in accordance with an embodiment, the receiver 300 includes a correlation-based value detector circuit 340 that processes the coded access address field 116 and/or the rate indicator field 120 without FEC decoder circuit 324 first decoding the coded access address field 116 and/or the rate indicator field 120. In at least some embodiments, the correlation-based value detector circuit 340 determines whether the address value in the coded access address field 116 corresponds to the receiver 300 more quickly as compared to the straightforward approach described above. In at least some embodiments, because the conelation-based value detector circuit 340 more quickly determines whether the address value in the coded access address field 116 corresponds to the receiver 300, the receiver 300 (or at least some components thereof) is able to go into a low power mode more quickly when the packet 100 is not intended for the receiver 300. In some embodiments, because the FEC decoder circuit 324 is not needed for determining whether the address value in the coded access address field 116 corresponds to the receiver 300, the FEC decoder circuit 324 can be kept in a low power mode until the correlation-based value detector circuit 340 determines that the address value in the coded access address field. 116 corresponds to the receiver 300, thus saving power.

In at least some embodiments, the correlation-based value detector circuit 340 determines a data rate indicated by the rate indicator field 120 more quickly as compared to the straightforward approach described above. In at least some embodiments, because the correlation-based value detector circuit 340 more quickly determines the data rate indicated by the rate indicator field 120, less buffering of signal data is required and thus a size of the memory (not shown) for buffering the signal data can be reduced as compared to the straightforward approach.

A controller 344 receives address detection and/or data rate information from the correlation-based value detector circuit 340, according to an embodiment. The controller 344 is configured to transition one or more components of the receiver 300 from a low power mode to an active mode in response to the correlation-based value detector circuit 340 detecting an address of the receiver 300, according to an embodiment. The controller 344 is configured to control one or more components of the receiver 300 to process data received subsequent to the RI field 120 (e.g., the data field 132, the CRC field 136, etc.) according to a data rate detected by the correlation-based value detector circuit 340, according to an embodiment. For example, the controller 344 is coupled to the demodulator circuit 316 and is configured to control the demodulator circuit 316 according to the detected data rate, according to an embodiment. As another example, the controller 344 is coupled to the demapper circuit 320 and is configured to control the demapper circuit 320 according to the detected data rate, according to an embodiment. As yet another example, the controller 344 is configured to cause the demapper circuit 320 to be bypassed in response to one or more particular data rates being detected, where the one or more particular data rates do not require demapping, according to an embodiment.

As still another example, the controller 344 is configured to cause the FEC decoder circuit 324 to be bypassed in response to one or more particular data rates being detected, where the one or more particular data rates do not involve FEC encoding, according to an embodiment. As still another example, the controller 344 is configured to cause the FEC decoder circuit 324 to go into (or remain in) a low power mode in response to one or more particular data rates being detected, where the one or more particular data rates do not involve FEC encoding, according to an embodiment.

One or more operations of the circuit components of FIG. 3 alternatively are implemented by one or more processors (e.g., digital signal processors (DSPs)) executing machine readable instructions (e.g., software or firmware instructions) stored in one or more memory devices (e.g., a random access memory (RAM), a read-only memory (ROM), a Flash memory, or other suitable computer readable media), in some embodiments. For example, operations of one or more of the demodulator circuit 316, the demapper circuit 324, and the FEC decoder circuit 324 are implemented by one or more processors (e.g., DSPs) executing machine readable instructions stored in one or more memory devices, in some embodiments.

Figure 4:
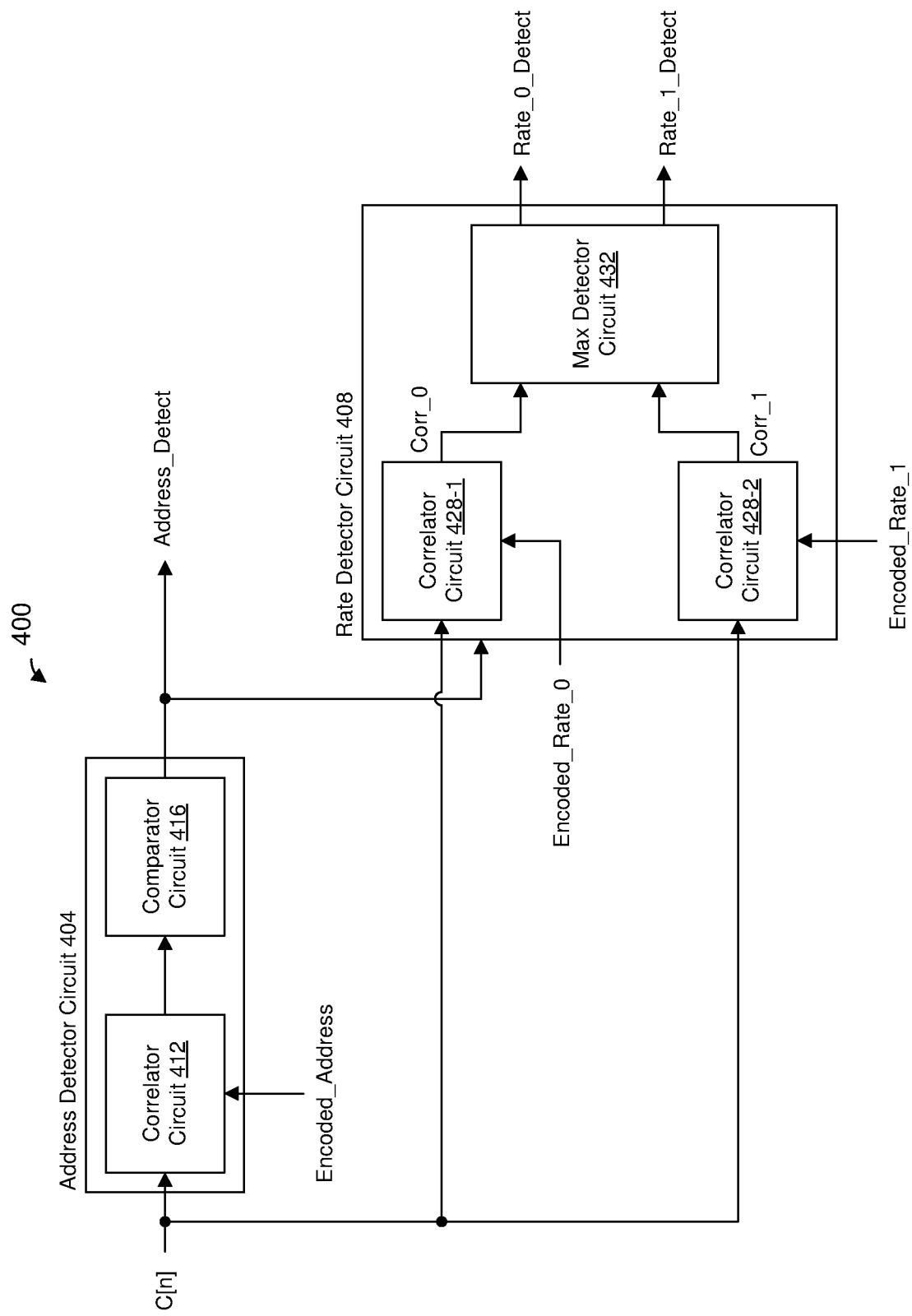
FIG. 4 is a block diagram an example correlation-based value detector, according to an embodiment.

FIG. 4 is a diagram of an example correlation-based value detector circuit 400, according to an embodiment. The correlation-based value detector circuit 400 is used as the correlation-based value detector circuit 340 in the receiver 300 of FIG. 3, in an embodiment, and is described with reference to FIG. 3 for explanatory purposes. In other embodiments, however, the correlation-based value detector circuit 400 is included in another suitable receiver different than the receiver 300, and/or the receiver 300 includes another suitable correlation-based value detector different than the correlation-based value detector circuit 400. The correlation-based value detector circuit 400 detects one or more values in packets having the packet format 100 of FIG. 1, in an embodiment, and is described with reference to FIG. 1 for explanatory purposes. In other embodiments, however, the correlation-based value detector circuit 400 detects values in packets having another suitable format different than the packet format 100 of FIG. 1.

The correlation-based value detector circuit 400 is configured to determine whether the encoded address value in the coded access address field 116 corresponds to an address of the receiver 300, in an embodiment. The correlation-based value detector circuit 400 is also configured to determine whether the encoded rate value in the rate indicator field 120 indicates the first data rate or the second data rate, in an embodiment. The correlation-based value detector circuit 400 facilitates detecting whether a packet is addressed to the receiver 300 without first decoding an address field in the packet using the FEC decoder circuit 324, according to an embodiment. Thus, processing delays associated with the decoding the address field in the packet using the FEC decoder circuit 324 are avoided, according to an embodiment. Similarly, the correlation-based value detector circuit 400 facilitates determining a data rate at which a payload of the packet has been transmitted without first decoding a rate indicator field in the packet using the FEC decoder circuit 324, according to an embodiment. Thus, processing delays associated with the decoding the rate indicator field in the packet using the FEC decoder circuit 324 are avoided, according to an embodiment.

The correlation-based value detector circuit 400 includes an address detector circuit 404 and a rate value detector circuit 408.

The address detector circuit 404 includes a correlator circuit 412 and a comparator circuit 416. The correlator circuit 412 correlates a bit sequence C[n] with a sequence (Encoded_Address), where C[n] corresponds to a signal received by the receiver and Encoded_Address corresponds to an FEC encoded address of the receiver 300. In an embodiment, C[n] is an output of the demapper circuit 320. In an embodiment, Encoded_Address is the address of the receiver 300 encoded using an FEC code that the transmitter used to generate an address field in the packet. For instance, if the transmitter used a BCC to encode the coded access address field 116, Encoded_Address is the address of the receiver 300 encoded using the same BCC.

In an embodiment, the FEC encoder at the transmitter maps different uncoded receiver addresses to different values of Encoded_Address (also referred to herein as "codewords") that are separated at by a minimum Hamming distance corresponding to the FEC implemented by the FEC encoder. The Hamming distance between two codewords is the number of positions at which corresponding bits are different. Thus, Encoded_Address of the receiver is at least the minimum Hamming distance from an encoded address of any other receiver.

In an embodiment, Encoded_Address comprises k bits, where k is a suitable positive integer. For example, the address of the receiver is a 32-bit value and the Encoded_Address comprises a 64-bit value (i.e., k=64), according to an illustrative embodiment. The correlator circuit 412 includes k−1 memory elements (e.g., arranged as a shift register) to store the last k−1 received values of C[n] (e.g., C[n−1], C[n−2], . . . C[k−1]), according to an embodiment. In an embodiment, when the correlator circuit 412 receives a new value of C[n], the correlator circuit 412 is configured to count how many bits in C[n], C[n−1], . . . C[k−1] respectively match bits in Encoded_Address[0], Encoded_Address[1], . . . Encoded_Address[k−1], and output the count as a correlator output (Corr). Additionally, the correlator circuit 412 shifts in the received value of C[n] into the shift register.

The output of the correlator circuit 412 is provided to a comparator circuit 416. The comparator circuit 416 is configured to determine when the output of the correlator circuit 412 meets a threshold (e.g., is greater than the threshold, or is greater than or equal to the threshold), and to generate an output (Address_Detect) when the output of the correlator circuit 412 meets the threshold. Address_Detect indicates when the address detector circuit 404 has detected the address of the receiver 300 in a received signal.

In an embodiment, the threshold is set based on the minimum Hamming distance provided by the FEC encoder at the transmitter. In another embodiment, a value of the threshold is determined by trial and error, based on simulations, etc. In an embodiment, the threshold is set such that a probability that the address detector circuit 404 mistakenly detects the encoded address of another receiver in C[n] is suitably low (e.g., less than 1% for a particular signal-to-noise ratio (SNR), less than 0.1% for the particular SNR, less than 0.01% for the particular SNR, etc.).

In an embodiment in which the minimum Hamming distance is n and the number of bits in Encoded_Address is k, the threshold is set to be at least k−ceil(n/2), where "ceil( )" is the integer ceiling function.

The address detector circuit 404 is able to detect that C[n] corresponds to Encoded_Address even though C[n] does not exactly match Encoded_Address, for example, due to errors introduced as a result of noise, interference, etc. Additionally, because of the minimum Hamming distance provided by the FEC encoder, there is a suitably low probability that the address detector circuit 404 will mistakenly determine that C[n] corresponds to Encoded_Address when C[n] in fact corresponds to an encoded address of another receiver.

The rate value detector circuit 408 includes a plurality of correlator circuits 428 and a maximum value detector circuit 432. In some embodiments, the rate value detector circuit 408 includes one correlator circuit 428 for each permissible data rate value that can be included in the RI field 120 (e.g., one correlator circuit 428 for each permissible data rate at which a packet can be transmitted). Accordingly, in the embodiment illustrated in FIG. 4, the rate value detector circuit 408 is configured to detect one of two permissible data rate values (e.g., Rate_0 and Rate_1) in the RI field 120. In other embodiments in which more than two permissible data rate value can be included in the RI field 120 (e.g., the packet can be transmitted at more than two permissible data rates), the rate value detector circuit 408 includes more than two correlator circuits 428.

The correlator circuit 428-1 correlates C[n] with a sequence (Encoded_Rate_0), where Encoded_Rate_0 corresponds to an FEC encoded value corresponding to a first data rate among the plurality of permissible data rates at which the PHY payload 112 of the packet 100 can be transmitted. In an embodiment, Encoded_Rate_0 is a value indicating the first data rate encoded using an FEC code that the transmitter used to generate a rate indicator field in the packet. For instance, if the transmitter used a BCC to encode the RI field 120, Encoded_Rate_0 corresponds to the value indicating the first data rate encoded using the same BCC.

In an embodiment, Encoded_Rate_0 comprises p bits, where p is a suitable positive integer. For example, the value indicating the first data rate is a 5-bit value and the Encoded_Rate_0 comprises a 10-bit value (i.e., p=10), according to an illustrative embodiment. The correlator circuit 428-1 includes p−1 memory elements (e.g., arranged as a shift register) to store the last p−1 received values of C[n] (e.g., C[n−1], C[n−2], . . . C[p−1]), according to an embodiment. In an embodiment, when the correlator circuit 428-1 receives a new value of C[n], the correlator circuit 428-1 is configured to count how many bits in C[n], C[n−1], C[p−1] respectively match bits in Encoded_Rate_0[0], Encoded_Rate_0[1], . . . Encoded_Rate_0[p−1], and output the count as a correlator output (Corr_0). Additionally, the correlator circuit 428-1 shifts in the received value of C[n] into the shift register.

Similarly, the correlator circuit 428-2 correlates C[n] with a sequence (Encoded_Rate_1), where Encoded_Rate_1 corresponds to an FEC encoded value corresponding to a second data rate among the plurality of permissible data rates at which the PHY payload 112 of the packet 100 can be transmitted. In an embodiment, Encoded_Rate_1 is a value indicating the second data rate encoded using an FEC code that the transmitter used to generate the rate indicator field in the packet. For instance, if the transmitter used a BCC to encode the RI field 120, Encoded_Rate_1 corresponds to the value indicating the second data rate encoded using the same BCC.

In an embodiment, Encoded_Rate_1 comprises p bits. For example, the value indicating the second data rate is a 5-bit value and the Encoded_Rate_1 comprises a 10-bit value (i.e., p=10), according to an illustrative embodiment. The correlator circuit 428-2 includes p−1 memory elements (e.g., arranged as a shift register) to store the last p−1 received values of C[n] (e.g., C[n−1], C[n−2], . . . C[p−1]), according to an embodiment. In an embodiment, when the correlator circuit 428-2 receives a new value of C[n], the correlator circuit 428-2 is configured to count how many bits in C[n], C[n−1], . . . C[p−1] respectively match bits in Encoded_Rate_1[0], Encoded_Rate_1[1], Encoded_Rate_1[p−1], and output the count as a correlator output (Corr_1). Additionally, the correlator circuit 428-2 shifts in the received value of C[n] into the shift register.

The outputs of the correlator circuits 428 are provided to the maximum value detector circuit 432. The maximum value detector circuit 432 is configured to determine the maximum value from among the correlation outputs of the correlator circuits 428, and to generate an indicator of which correlation output among the correlation outputs of the correlator circuits 428 is the maximum value. For example, when maximum value detector circuit 432 determines that the output of the correlator circuit 4284 (Corr_0) is the maximum value, the maximum value detector circuit 432 generates an output Rate_0_Detect that indicates Rate_0 (corresponding to the first data rate) was detected; and when maximum value detector circuit 432 determines that the output of the correlator circuit 428-2 (Corr_1) is the maximum value, the maximum value detector circuit 432 generates an output Rate_1_Detect that indicates Rate_1 (corresponding to the second data rate) was detected, according to an embodiment.

In an embodiment in which there are only two permissible data rates (e.g., corresponding to Encoded_Rate_0 and Encoded_Rate_1), the maximum value detector circuit 432 comprises a comparator circuit that compares Corr_0 to Corr_1. In such an embodiment, the maximum value detector circuit 432 generates Rate_0_Detect when Corr_0>Con_1, and generates Rate_1_Detect when Corr_1>Corr_0.

In an embodiment, the maximum value detector circuit 432 determines the maximum value from among the correlation outputs of the correlator circuits 428 a defined time period after the address detector circuit 404 generates Address_Detect, which indicates that the address detector circuit 404 detected the address of the receiver 300 in the received signal. For example, in an embodiment in which the RI field 120 immediately follows the coded access address field 116 in the PHY header 108 and each encoded data rate value comprises p bits, the maximum value detector circuit 432 determines the maximum value from among the correlation outputs of the correlator circuits 428 after p values of CH have been received by each correlator circuit 428 in conjunction with the address detector circuit 404 generating Address_Detect.

In another embodiment, maximum value detector circuit 432 generates the indicator of which correlation output among the correlation outputs of the correlator circuits 428 is the maximum value optionally when the maximum value meets a threshold (e.g., is greater than the threshold, or is greater than or equal to the threshold). In such an embodiment, the maximum value detector 4 circuit 32 includes a comparator to compare the maximum value to the threshold.

In an embodiment, the threshold used by the maximum value detector circuit 432 is set based on the minimum Hamming distance provided by the FEC encoder at the transmitter. In another embodiment, a value of the threshold is determined by trial and error, based on simulations, etc. in an embodiment in which the minimum Hamming distance is n, the threshold is set to be at least p−ceil(n/2), where "ceil( )" is the integer ceiling function.

The rate detector circuit 408 is able to detect that CH corresponds to one of the encoded rate values even when C[n] does not exactly match the one encoded rate value due to errors introduced as a result of noise, interference, etc. Additionally, because of the minimum Hamming distance provided by the FEC encoder, there is a suitably low probability that the maximum value detector circuit 432 will mistakenly determine that C[n] corresponds to one encoded rate value (e.g., Encoded_Rate_0) when C[n] in fact corresponds to another encoded rate value corresponding to a different data rate (e.g., Encoded_Rate_1), and vice versa.

In an embodiment, the detector circuit 408 is configured to operate in response to the Address_Detect signal indicating that the address detector circuit 404 has detected the address of the receiver 300 in the received signal. For example, the correlator circuits 428 are configured to begin generating correlation output values in response to the Address_Detect signal indicating that the address detector circuit 404 has detected the address of the receiver 300 in the received signal, according to an embodiment.

One or more operations of the circuit components of FIG. 4 alternatively are implemented by one or more processors (e.g., DSPs) executing machine readable instructions stored in one or more memory devices, in some embodiments. For example, operations of one or more of the correlator circuit 412, the comparator circuit 416, and the correlator circuits 428, and the maximum value detector circuit 432 are implemented by one or more processors (e.g., DSPs) executing machine readable instructions stored in one or more memory devices, in some embodiments.

Figure 5:
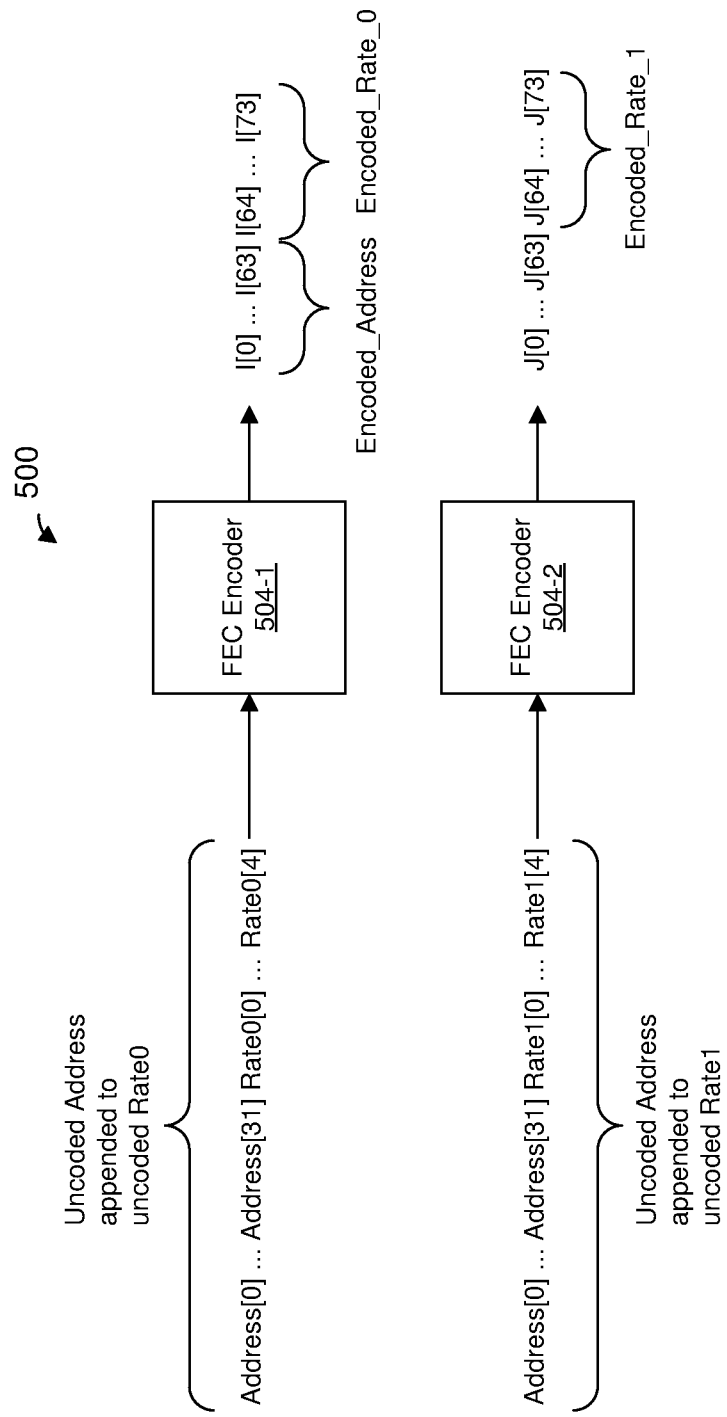
FIG. 5 is a block diagram of example generator for generating encoded values for use by the correlation-based value detector of FIG. 4, according to an embodiment.

Generation of Encoded_Address, Encoded_Rate_0, and Encoded_Rate_1, which are used by the address detector circuit 404 and the rate detector circuit 408, is discussed in more detail with reference to FIG. 5. FIG. 5 is an example generator 500 for generating i) an encoded address (e.g., Encoded_Address) corresponding to the address of the receiver, ii) respective encoded data rate indicators (e.g., Encoded_Rate_0 and Encoded_Rate_1) corresponding to different permissible rate indicators that can be included in a data rate indicator field of a packet, according to an embodiment. The generator 500 is used in conjunction with the correlation-based value detector circuit 400, in an embodiment, and is described with reference to FIG. 4 for explanatory purposes. In other embodiments, however, the generator 500 is used in conjunction with another suitable correlation-based value detector different than the correlation-based value detector circuit 400, and/or the correlation-based value detector circuit 400 is used in conjunction with another suitable generator different than the generator 500. Similarly, the generator 500 is used in the context of the packet format 100 of FIG. 1, in an embodiment, and is described with reference to FIG. 1 for explanatory purposes. In other embodiments, however, the generator 500 is used in the context of another suitable format different than the packet format 100 of FIG. 1.

The generator 500 generally recreates coded bit sequences generated at a transmitter (e.g., the transmitter 100 of FIG. 1) for headers of packets intended for the receiver 300 and with PHY payloads transmitted at different data rates, according to an embodiment.

The generator 500 includes one or more ITC encoders 504. Although FIG. 5 illustrates multiple FEC encoders 504, the generator 500 alternatively includes a single FEC encoder 504 that is reused multiple times, according to an embodiment. The FEC encoders 504 perform the same encoding technique as performed at the transmitter when the transmitter encodes the address field and data rate field in a PHY header of a packet. In an embodiment, each FEC encoder 504 is a BCC encoder. Iii other embodiments, each FEC encoder 504 performs another suitable type of encoding, such as LDPC encoding, Reed-Solomon encoding, turbo encoding, etc.

An uncoded address of the receiver 300 is appended to a first uncoded rate value corresponding to a first date rate, and input to the FEC encoder 504-1 to generate a coded sequence I. In an embodiment, the uncoded address comprises 32 bits, the first uncoded rate value comprises 5 bits, and the coded sequence I comprises 74 bits. In other embodiments, the uncoded address comprises another suitable number of bits, the first uncoded rate value comprises another suitable number of bits, and/or the coded sequence I comprises another suitable number of bits.

If a transmitter having the encoding portion 200 (FIG. 2) were to transmit the packet 100 to the receiver 300 with the PHY payload 112 transmitted at the first data rate, then the bit stream provided to the convolutional encoder circuit 204 to generate the coded access address field 116 and the RI field 120 in the packet would be the same as the input to the FEC encoder 5044 (e.g., Address[0] . . . Address[31] Rate0[0] . . . Rate0[4]), according to an embodiment. Thus, the FEC encoder 504-1 is recreating the output of the FEC encoder 108 at the transmitter 100 for such a packet, according to an embodiment.

Encoded_Address is set to a first portion of the coded sequence I (e.g., bits 0-63) that corresponds to the uncoded address (e.g., Address[0] . . . Address[31]), according to an embodiment. Encoded_Rate_0 is set to a second portion of the coded sequence I (e.g., bits 64-73) that corresponds to the first uncoded rate value (e.g., Rate0[0] . . . Rate0[4]), according to an embodiment.

The uncoded address of the receiver 300 is appended to a second uncoded rate value corresponding to the second date rate, and input to the FEC encoder 504-2 to generate a coded sequence J. In an embodiment, the uncoded address comprises 32 bits, the second uncoded rate value comprises 5 bits, and the coded sequence J comprises 74 bits. In other embodiments, the uncoded address comprises another suitable number of bits, the second uncoded rate value comprises another suitable number of bits, and/or the coded sequence J comprises another suitable number of bits.

If a transmitter having the encoding portion 200 (FIG. 2) were to transmit the packet 100 to the receiver 300 with the PRY payload 112 transmitted at the second data rate, then the bit stream provided to the convolutional encoder circuit 204 to generate the coded access address field 116 and the RI field 120 in the packet would be the same as the input to the FEC encoder 504-2 (e.g., Address[0] . . . Address[31] Rate1[0] . . . Rate1[4]), according to an embodiment. Thus, the FEC encoder 504-2 is recreating the output of the convolutional encoder circuit 204 at the transmitter for such a packet, according to an embodiment.

A first portion of the coded sequence J (e.g., bits 0-63) corresponds to the uncoded address (e.g., Address[0] . . . Address[31]), according to an embodiment. Encoded_Rate_1 is set to a second portion of the coded sequence J (e.g., bits 64-73) that corresponds to the second uncoded rate value (e.g., Rate1[0] . . . Rate1[4]), according to an embodiment.

A first portion of the coded sequence J (e.g., bits 0-63) is equal to the first portion of the coded sequence I (e.g., bits 0-63), according to an embodiment. Thus, in an embodiment, Encoded_Address is set to the first portion of the coded sequence J (e.g., bits 0-63), rather than being set to the first portion of the coded sequence I.

The generator 500 is included in the receiver 300, according to an embodiment. If the receiver 300 is included in a communication device having a transmitter with an FEC encoder (such as the convolutional encoder circuit 204 of FIG. 2), the generator 500 is implemented with the FEC encoder of the transmitter, according to an embodiment. In an embodiment, the generator 500 is included in a device separate from the receiver 300, and the encoded address (e.g., Encoded_Address) and encoded data rate values (e.g., Encoded_Rate_0 and Encoded_Rate_1) are received by the receiver 300 and stored in a memory device of the receiver 300. In an embodiment, the encoded address (e.g., Encoded_Address) and encoded data rate values (e.g., Encoded_Rate_0 and Encoded_Rate_1) are stored in the memory device of the receiver 300 when the receiver 300 is manufactured or otherwise prior to delivery of the receiver 300 to an end user or service provider. In an embodiment, the encoded address (e.g., Encoded_Address) and encoded data rate values (e.g., Encoded_Rate_0 and Encoded_Rate_1) are generated during a startup procedure of the receiver 300 (and/or a startup procedure of a communication device that includes the receiver 300) and stored in the memory device of the receiver 300.

Referring again to FIG. 4, if the encoded address (e.g., Encoded_Address) and encoded data rate values (e.g., Encoded_Rate_0 and Encoded_Rate_1) are stored in the memory device of the receiver 300, the encoded address (e.g., Encoded_Address) and encoded data rate values (e.g., Encoded_Rate_0 and Encoded_Rate_1) are retrieved from the memory device and provided to the address detector circuit 404 and the rate detector circuit 408, according to an embodiment.

Figure 6:
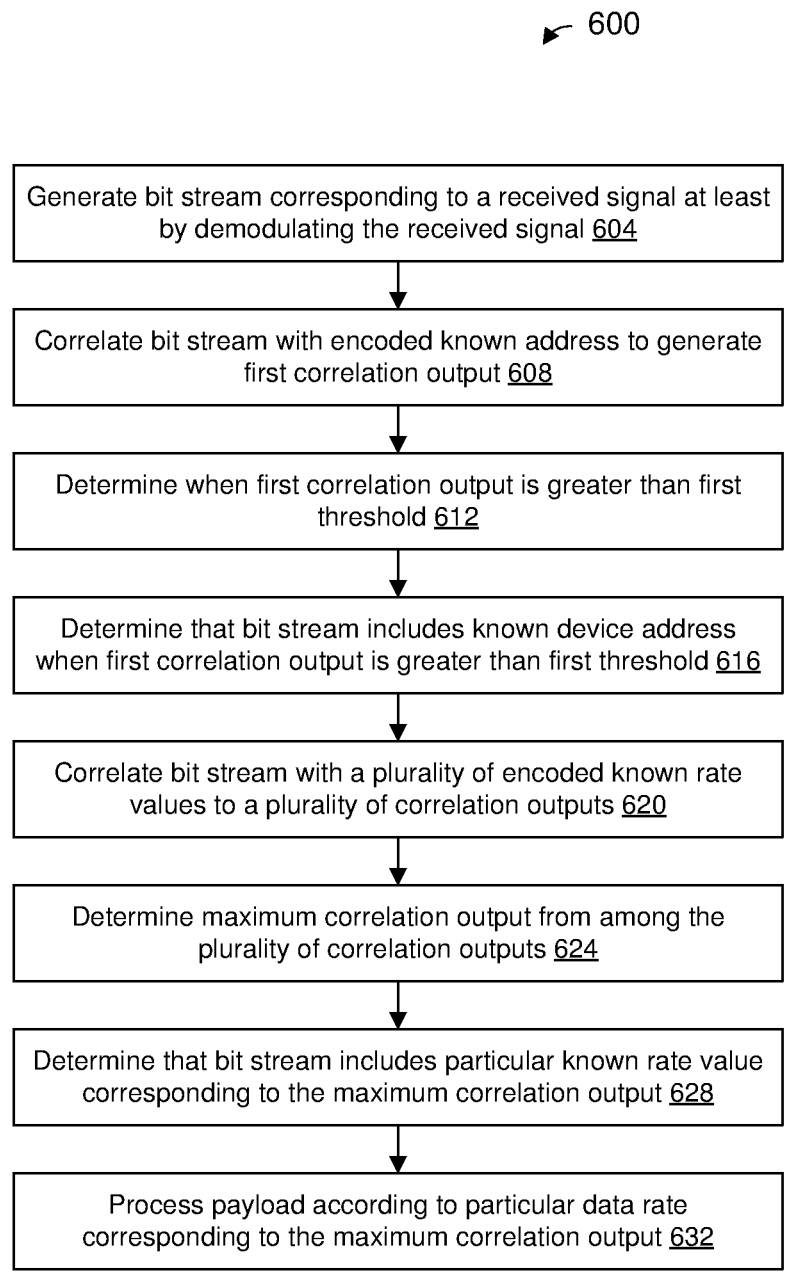
FIG. 6 is a flow diagram of an example method for processing a received signal corresponding to a packet, according to an embodiment.

FIG. 6 is a flow diagram of an example method 600 for processing a received signal corresponding to a packet, the received signal having been transmitted by a transmitter device, according to an embodiment. The packet includes an address field having an address that was encoded at the transmitter device using a forward error correction (FEC) code, according to an embodiment. In some embodiments, the packet also includes a rate indication (RI) field having a rate value indicating a data rate at which a data portion of the packet was transmitted, the rate value having been encoded at the transmitter device using the FEC code, according to an embodiment.

In some embodiments, the receiver 300 of FIG. 3 is configured to implement the method. 600, and the method 600 is described with reference to FIG. 3 merely for explanatory purposes. In other embodiments, the method 600 is implemented by another suitable receiver device different than the receiver 300. In some embodiments, the correlation-based value detector circuit 400 of FIG. 4 is configured to implement at least portions of the method 600, and the method 600 is described with reference to FIG. 4 merely for explanatory purposes. In other embodiments, the method 600 is implemented using another suitable correlation-based value detector different than the correlation-based value detector circuit 400. In some embodiments, the method 600 processing packets having the format 100 of FIG. 1, and the method 600 is described with reference to FIG. 1 merely for explanatory purposes. In other embodiments, the method 600 is processing packets having other suitable packet formats different than the format 100 of FIG. 1.

At block 604, the receiver device generates a bit stream corresponding to the received signal at least by demodulating the received signal. For example, the demodulator circuit 316 and the demapper circuit 320 generate a bit stream based on a received signal received via the antenna 304, according to an embodiment. In another embodiment in which the receiver 300 does not include the demapper circuit 320, the demodulator circuit 316 generates the bit stream based on the received signal.

At block 608, the receiver device correlates the bit stream with an encoded known address to generate a first correlation output that indicates a degree of similarity between a first segment of the bit stream and the encoded known address. The encoded known address corresponds to a known device address that was encoded using the error correction code, according to an embodiment. For example, the correlator circuit 412 correlates the bit stream C[n] with Encoded_Address, according to an embodiment.

At block 612, the receiver device determines when the first correlation output is greater than a first threshold. The first threshold corresponds to a particular degree of similarity with the encoded known address, according to an embodiment. For example, the comparator circuit 416 determines when the output of the correlator circuit 412 greater than a first threshold, according to an embodiment.

At block 616, the receiver device determines that the bit stream includes the known device address when the receiver device determines that the first correlation output is greater than the first threshold. For example, the comparator circuit 416 generates Address_Detect when the output of the correlator circuit 412 greater than the first threshold, which indicates that the address of the receiver was detected in the bit stream C[n], according to an embodiment.

At block 620, the receiver device correlates the bit stream with a plurality of encoded permissible data rate values to generate a plurality of correlation outputs. In an embodiment, each correlation output indicates a degree of similarity between a second segment of the bit stream and the respective encoded permissible data rate value. In an embodiment, each encoded permissible data rate value corresponds to a respective permissible data rate value among a plurality of permissible data rate values according to which the transmitter is permitted to transmit. In an embodiment, each encoded permissible data rate value corresponds to a respective permissible data rate value that was encoded using the error correction code.

In an embodiment, the plurality of encoded permissible data rate values includes a first encoded permissible data rate value and a second encoded permissible data rate value. The first encoded permissible data rate value corresponds to a first permissible data rate value that was encoded using the error correction code, and the first permissible data rate value corresponds to a first permissible data rate, according to an embodiment. For example, the correlator circuit 428-1 correlates the bit stream C[n] with Encoded_Rate_0 to generate a first correlation output, according to an embodiment. The second encoded permissible data rate value corresponds to a second permissible data rate value that was encoded using the error correction code, and the second permissible data rate value corresponds to a second permissible data rate, according to an embodiment. For example, the correlator circuit 428-2 correlates the bit stream C[n] with Encoded_Rate_1 to generate a second correlation output, according to an embodiment.

At block 624, the receiver device determines a maximum correlation value from among the plurality of correlation outputs, where the maximum correlation value indicates which encoded permissible data rate value, from among the plurality of encoded permissible data rate values, is included in the bit stream. In an embodiment in which the plurality of correlation outputs includes a first correlation output and a second correlation output, block 624 includes determining whether the first correlation output or the second correlation output is the maximum correlation value. In an embodiment in which the plurality of correlation outputs includes a first correlation output and a second correlation output, block 624 includes determining whether the first correlation output is greater than the second correlation output; and when the first correlation output is determined to be greater than the second correlation output, the first correlation output is determined to be the maximum correlation output, whereas when the first correlation output is determined to be less than the second correlation output, the second correlation output is determined to be the maximum correlation output.

At block 628, the receiver device determines that the bit stream includes a particular permissible data rate value that corresponds to the maximum correlation output determined at block 624. For example, the maximum value detector circuit 432 generates Rate_0_Detect when the output of the correlator circuit 428-1 is the maximum from among the plurality of correlator circuits 428, according to an embodiment. As another example, the maximum value detector circuit 432 generates Rate_0_Detect when the output of the correlator circuit 428-1 is the maximum from among the plurality of correlator circuits 428, according to an embodiment. In an embodiment in which the plurality of correlation outputs includes a first correlation output and a second correlation output, when the first correlation output is determined at block 624 to be greater than the second correlation output, the receiver determines that the bit stream includes a first permissible data rate value, whereas when the first correlation output is determined to be less than the second correlation output, the receiver determines that the bit stream includes a second permissible data rate value. For example, when the maximum value detector circuit 432 determines that the output of the correlator circuit 428-1 is greater than the output of the correlator circuit 428-2, the maximum value detector circuit 432 generates Rate_0_Detect, whereas when the maximum value detector circuit 432 determines that the output of the correlator circuit 428-1 is less than the output of the correlator circuit 428-2, the maximum value detector circuit 432 generates Rate_1_Detect.

At block 632, in response to determining that the bit stream includes the particular permissible data rate value, the receiver processes a payload of the packet according to the particular permissible data rate value. For example, the controller 344 controls at least one of the demodulator circuit 316, the demapper circuit 320, and the digital processing circuitry 328 to process the payload of the packet according to the first particular data rate in response to the maximum value detector circuit 432 generating Rate_0_Detect, whereas the controller 344 controls at least one of the demodulator circuit 316, the demapper circuit 320, and the digital processing circuitry 328 to process the payload of the packet according to the second particular data rate in response to the maximum value detector circuit 432 generating Rate_1_Detect, according to an embodiment.

In some embodiments, the operations of blocks 620-632 are performed in response to the receiver device determining, at block 616, that the bit stream includes the known device address.

In some embodiments, the operations of blocks 620-632 are omitted. For example, with packets that can only be transmitted at a single data rate and/or that omit a rate field such as the RI field 120, the operations of blocks 620-632 are omitted, according to an embodiment. As another example, another suitable technique for determining a data rate at which the packet was transmitted is used instead of performing the operations of blocks 620-632, according to an embodiment.

In some embodiments, the operations of blocks 608-616 are omitted. For example, another suitable technique for determining whether the packet includes an address corresponding to the receiver is used instead of performing the operations of blocks 608-616, according to an embodiment.

Embodiment 1: A method for processing a received signal corresponding to a packet, the received signal having been transmitted by a transmitter device, wherein the packet includes an address field having an address, and wherein the address has been encoded at the transmitter device using a forward error correction code, the method comprising: generating, at a receiver device, a bit stream corresponding to the received signal at least by demodulating the received signal; correlating, at the receiver device, the bit stream with an encoded known address to generate a correlation output that indicates a degree of similarity between a segment of the bit stream and the encoded known address, wherein the encoded known address corresponds to a known device address that was encoded using the error correction code; determining, at the receiver device, when the correlation output is greater than a threshold, wherein the threshold corresponds to a particular degree of similarity with the encoded known address; and determining, at the receiver device, that the bit stream includes the known device address when the receiver device determines that the correlation output is greater than the threshold.

Embodiment 2: The method of embodiment 1, wherein: the error correction code is a convolutional error correction code; and the encoded known address corresponds to the known device address that was encoded using the convolutional error correction code.

Embodiment 3: The method of embodiment 2, wherein: the convolutional error correction code is a binary convolutional code (BCC); and the encoded known address corresponds to the known device address that was encoded using the BCC.

Embodiment 4: The method of any of embodiments 1-3, wherein the threshold is a first threshold, the correlation output is a first correlation output, and the segment is a first segment, wherein the packet also includes a rate indicator field to indicate a data rate at which a payload of the packet was transmitted, and wherein the method further comprises: correlating, at the receiver device, the bit stream with a plurality of encoded permissible data rate values to generate a plurality of second correlation outputs, wherein each second correlation output indicates a degree of similarity between a second segment of the bit stream and a respective one of the plurality of encoded permissible data rate values, wherein each encoded permissible data rate value corresponds to a respective permissible data rate value that was encoded using the error correction code, and wherein each permissible data rate value corresponds to a respective particular data rate of packet payloads; determining, at the receiver device, a maximum correlation value from among the plurality of second correlation outputs; determining, at the receiver device, that the bit stream includes the permissible data rate value that corresponds to the maximum correlation value from among the plurality of second correlation outputs; and in response to determining that the bit stream includes the permissible data rate value, processing a payload of the packet according to the particular data rate that corresponds to the permissible data rate value.

Embodiment 5: The method of embodiment 4, wherein: a first unencoded sequence comprises the known device address appended with the first permissible data rate value; a first encoded sequence corresponds to the first unencoded sequence having been encoded using the error correction code; the encoded known address corresponds to a first segment of the first encoded sequence; a first encoded permissible data rate value, from among the plurality of encoded permissible data rate values, corresponds to a second segment of the first encoded sequence; a second unencoded sequence comprises the known device address appended with the second permissible data rate value; a second encoded sequence corresponds to the second unencoded sequence having been encoded using the error correction code; and a second encoded permissible data rate value, from among the plurality of encoded permissible data rate values, corresponds to a segment of the second encoded sequence.

Embodiment 6: A communication device, comprising: receiver circuitry configured to generate a bit stream corresponding to a received signal, the received signal having been transmitted by a transmitter device, wherein the circuitry includes a demodulator configured to demodulate the received signal, wherein the received signal corresponds to a packet, wherein the packet includes an address field having an address, and wherein the address has been encoded at the transmitter device using a forward error correction code; address detection circuitry: that is configured to determine whether the bit stream includes a known device address, wherein the address detection circuitry comprises: a correlator configured to correlate the bit stream with an encoded known address to generate a correlation output that indicates a degree of similarity between a segment of the bit stream and the encoded known address, wherein the encoded known address corresponds to the known device address having been encoded using the error correction code, and a comparator; wherein the comparator is configured to: determine when the correlation output is greater than a threshold, wherein the threshold corresponds to a particular degree of similarity with the encoded known address, and generate a signal that indicates that the bit stream includes the known device address when the correlation output is determined to be greater than the threshold.

Embodiment 7: The communication device of embodiment 6, wherein: the error correction code is a convolutional error correction code; and the encoded known address corresponds to the known device address that was encoded using the convolutional error correction code.

Embodiment 8: The communication device of embodiment 7, wherein: the convolutional error correction code is a binary convolutional code (BCC); and the encoded known address corresponds to the known device address that was encoded using the BCC.

Embodiment 9: The communication device of any of embodiments 6-8, wherein the correlator is a first correlator, the correlation output is a first correlation output, and the segment is a first segment, wherein the packet also includes a rate indicator field to indicate a data rate at which a payload of the packet was transmitted, and wherein the communication device further comprises: rate detection circuitry that is configured to determine a particular permissible data rate value, from among a plurality of permissible data rate values, that corresponds to the bit stream, wherein the address detection circuitry comprises: a plurality of second correlators that are configured to correlate the bit stream with respective encoded permissible data rate values to generate respective second correlation outputs, wherein each second correlation output indicates a degree of similarity between a second segment of the bit stream and the respective encoded permissible data rate value, wherein each encoded permissible data rate value corresponds to a respective permissible data rate value that was encoded using the error correction code, and a maximum value detection circuit configured to: determine a maximum correlation value from among the plurality of second correlation outputs, and generate a signal that indicates the permissible data rate value corresponding to the maximum correlation value; and digital processing circuitry configured to process the payload of the packet according to a particular data rate, from among a plurality of permissible data rates, in response to the signal that indicates the permissible data rate value corresponding to the maximum correlation value.

Embodiment 10: The communication device of embodiment 9, wherein: a first unencoded sequence comprises the known device address appended with the first permissible data rate value; a first encoded sequence corresponds to the first unencoded sequence having been encoded using the error correction code; the encoded known address corresponds to a first segment of the first encoded sequence; a first encoded known data rate value, from among the plurality of encoded permissible data rate values, corresponds to a second segment of the first encoded sequence; a second unencoded sequence comprises the known device address appended with the second permissible data rate value; a second encoded sequence corresponds to the second unencoded sequence having been encoded using the error correction code; and a second encoded permissible data rate value, from among the plurality of encoded permissible data rate values, corresponds to a segment of the second encoded sequence.

Embodiment 11: A method for processing a received signal corresponding to a packet, the received signal having been transmitted by a transmitter device, wherein the packet includes a rate indicator field to indicate a data rate at which a payload of the packet was transmitted, and wherein the rate indicator field has been encoded at the transmitter device using a forward error correction code, the method comprising: generating, at a receiver device, a bit stream corresponding to the received signal at least by demodulating the received signal; correlating, at the receiver device, the bit stream with a plurality of encoded permissible data rate values to generate a plurality of correlation outputs, wherein each correlation output indicates a degree of similarity between a segment of the bit stream and a respective encoded permissible data rate value, wherein each encoded permissible data rate value corresponds to a respective permissible data rate value that was encoded using the error correction code, and wherein each permissible data rate value corresponds to a respective data rate; determining, at the receiver device, a maximum correlation value from among the plurality of correlation outputs; determining, at the receiver device, that the bit stream includes a particular permissible data rate value that corresponds to the maximum correlation value from among the plurality of correlation outputs; and in response to determining that the bit stream includes the particular permissible data rate value, processing a payload of the packet according to a particular data rate that corresponds to the particular permissible data rate value.

Embodiment 12: The method of embodiment 11, wherein: the error correction code is a convolutional error correction code; and the encoded permissible data rate value corresponds to the permissible data rate value that was encoded using the convolutional error correction code.

Embodiment 13: The method of embodiment 12, wherein: the convolutional error correction code is a binary convolutional code (BCC); and the encoded permissible data rate value corresponds to the permissible data rate value that was encoded using the BCC.

Embodiment 14: The method of any of embodiments 11-13, wherein the plurality of encoded permissible data rate values includes a first encoded permissible data rate value and a second encoded permissible data rate value, wherein the plurality of correlation outputs includes a first correlation output corresponding to the first encoded permissible data rate value and a second correlation output corresponding to the second encoded permissible data rate value, wherein the plurality of permissible data rate values includes a first permissible data rate value and a second permissible data rate value, wherein the first permissible data rate value corresponds to a first data rate, and wherein the second permissible data rate value corresponds to a second data rate; wherein determining that the bit stream includes the particular permissible data rate value that corresponds to the maximum correlation value comprises: determining that the bit stream includes the first permissible data rate value when the first correlation output is determined to be the maximum correlation value, and determining that the bit stream includes the second permissible data rate value when the second correlation output is determined to be the maximum correlation value; and wherein the method further comprises: in response to determining that the bit stream includes the first permissible data rate value, processing the payload of the packet according to the first data rate, and in response to determining that the bit stream includes the second permissible data rate value, processing the payload of the packet according to the second data rate.

Embodiment 15: The method of embodiment 14, wherein determining the maximum correlation value from among the plurality of second correlation outputs comprises determining whether the first correlation output is greater than the second correlation output; and wherein determining that the bit stream includes the particular permissible data rate value that corresponds to the maximum correlation value comprises: determining that the bit stream includes the first permissible data rate value when the first correlation output is greater than the second correlation output, and determining that the bit stream includes the second permissible data rate value when the first correlation output is less than the second correlation output.

Embodiment 16: A communication device, comprising: receiver circuitry configured to generate a bit stream corresponding to a received signal, the received signal having been transmitted by a transmitter device, wherein the circuitry includes a demodulator configured to demodulate the received signal, wherein the received signal corresponds to a packet, wherein the packet includes a rate indicator field to indicate a data rate at which a payload of the packet was transmitted, and wherein the rate indicator field has been encoded at the transmitter device using a forward error correction code; rate detection circuitry that is configured to determine whether the bit stream includes a permissible data rate value, wherein the permissible data rate value corresponds to a particular data rate, and wherein the address detection circuitry comprises: a plurality of correlators configured to correlate the bit stream with a plurality of encoded permissible data rate values to generate a plurality of correlation outputs, wherein each correlation output indicates a respective degree of similarity between a segment of the bit stream and a respective encoded permissible data rate value, wherein each encoded permissible data rate value corresponds to a respective permissible data rate value that was encoded using the forward error correction code, and a maximum value detector configured to: determine a maximum correlation value from among the plurality of correlation outputs and generate a signal that indicates that the bit stream includes a particular permissible rate that corresponds to the maximum correlation value; and digital processing circuitry configured to process the payload of the packet according to the particular permissible data rate in response to the signal that indicates that the hit stream includes the particular permissible rate.

Embodiment 17: The communication device of embodiment 16, wherein: the error correction code is a convolutional error correction code; and the encoded permissible data rate value corresponds to the permissible data rate value that was encoded using the convolutional error correction code.

Embodiment 18: The communication device of embodiment 17, wherein: the convolutional error correction code is a binary convolutional code (BCC); and the encoded permissible data rate value corresponds to the permissible data rate value that was encoded using the BCC.

Embodiment 19: The communication device of any of embodiments 16-18, wherein the plurality of encoded permissible data rate values includes a first encoded permissible data rate value and a second encoded permissible data rate value, wherein the plurality of permissible data rate values includes a first permissible data rate value and a second permissible data rate value, wherein the first permissible data rate value corresponds to a first data rate, and wherein the second permissible data rate value corresponds to a second data rate; wherein the plurality correlators includes: a first correlator configured to correlate the bit stream with the first encoded permissible data rate value to generate a first correlation output that indicates a degree of similarity between the segment of the bit stream and the first encoded permissible data rate value, and a second correlator configured to correlate the bit stream with the second encoded permissible data rate value to generate a second correlation output that indicates a degree of similarity between the segment of the bit stream and the second encoded permissible data rate value; wherein the maximum value detector is configured to: generate the signal to indicate that the bit stream includes the first permissible data rate value when the first correlation output is determined to be the maximum correlation value, and generate the signal to indicate that the bit stream includes the second permissible data rate value when the second correlation output is determined to be the maximum correlation value; and wherein the digital processing circuitry configured to: in response to determining that the bit stream includes the first permissible data rate value, process the payload of the packet according to the first data rate, and in response to determining that the bit stream includes the second permissible data rate value, process the payload of the packet according to the second data rate.

Embodiment 20: The communication device of embodiment 19, wherein the maximum value detector is configured to: determine whether the first correlation output is greater than the second correlation output; generate the signal to indicate that the bit stream includes the first permissible data rate value when the first correlation output is greater than the second correlation output; and generate the signal to indicate that the bit stream includes the second permissible data rate value when the first correlation output is less than the second correlation output.

At least some of the various blocks, operations, and techniques described above may be implemented utilizing hardware, a processor executing firmware instructions, a processor executing software instructions, or any combination thereof.

When implemented in hardware, the hardware may comprise one or more of discrete components, an integrated circuit, an application-specific integrated circuit (ASIC), a programmable logic device (PLD), etc.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A method for processing a received signal corresponding to a packet, the received signal having been transmitted by a transmitter device, wherein the packet includes i) an address field having an address, and ii) a rate indicator field to indicate a data rate at which a payload of the packet was transmitted, and wherein the address and a value of the rate indicator field have been encoded at the transmitter device using a forward error correction code, the method comprising:

generating, at a receiver device, a bit stream corresponding to the received signal at least by demodulating the received signal;

correlating, at the receiver device, the bit stream with an encoded known address to generate a first correlation output that indicates a degree of similarity between a first segment of the bit stream and the encoded known address, wherein the encoded known address corresponds to a known device address that was encoded using the forward error correction code;

determining, at the receiver device, when the first correlation output is greater than a threshold, wherein the threshold corresponds to a particular degree of similarity with the encoded known address;

determining, at the receiver device, that the bit stream includes the known device address when the receiver device determines that the first correlation output is greater than the threshold;

correlating, at the receiver device, the bit stream with a plurality of encoded permissible data rate values to generate a plurality of second correlation outputs, wherein each second correlation output indicates a degree of similarity between a second segment of the bit stream and a respective one of the plurality of encoded permissible data rate values, wherein each encoded permissible data rate value corresponds to a respective permissible data rate value that was encoded using the forward error correction code, and wherein each permissible data rate value corresponds to a respective particular data rate of packet payloads;

determining, at the receiver device, that the bit stream includes one of the permissible data rate values using the plurality of second correlation outputs; and in response to determining that the bit stream includes the one of the permissible data rate values, processing a payload of the packet according to the particular data rate that corresponds to the one of the permissible data rate values.

2. The method of claim 1, wherein:
the forward error correction code is a convolutional error correction code; and
the encoded known address corresponds to the known device address that was encoded using the convolutional error correction code.

3. The method of claim 2, wherein:
the convolutional error correction code is a binary convolutional code (BCC); and
the encoded known address corresponds to the known device address that was encoded using the BCC.

4. The method of claim 1, further comprising:
determining, at the receiver device, a maximum correlation value from among the plurality of second correlation outputs;
wherein determining that the bit stream includes the one of the permissible data rate values includes selecting the one of the permissible data rate values as corresponding to the maximum correlation value from among the plurality of second correlation outputs.

5. The method of claim 4, wherein:
a first unencoded sequence comprises the known device address appended with the first permissible data rate value;
a first encoded sequence corresponds to the first unencoded sequence having been encoded using the forward error correction code;
the encoded known address corresponds to a first segment of the first encoded sequence;
a first encoded permissible data rate value, from among the plurality of encoded permissible data rate values, corresponds to a second segment of the first encoded sequence;
a second unencoded sequence comprises the known device address appended with the second permissible data rate value;
a second encoded sequence corresponds to the second unencoded sequence having been encoded using the forward error correction code;
a second encoded permissible data rate value, from among the plurality of encoded permissible data rate values, corresponds to a segment of the second encoded sequence; and
correlating the bit stream with the plurality of encoded permissible data rate values includes i) correlating the bit stream with the first encoded permissible data rate value to generate one second correlation output among the plurality of second correlation outputs, and ii) correlating the bit stream with the second encoded permissible data rate value to generate another second correlation output among the plurality of second correlation outputs.

6. A communication device, comprising:
receiver circuitry configured to generate a bit stream corresponding to a received signal, the received signal having been transmitted by a transmitter device, wherein the circuitry includes a demodulator configured to demodulate the received signal, wherein the received signal corresponds to a packet, wherein the packet includes i) an address field having an address and ii) a rate indicator field to indicate a data rate at which a payload of the packet was transmitted, and wherein the address and a value of the rate indicator field have been encoded at the transmitter device using a forward error correction code;
address detection circuitry that is configured to determine whether the bit stream includes a known device address, wherein the address detection circuitry comprises:
a first correlator configured to correlate the bit stream with an encoded known address to generate a first correlation output that indicates a degree of similarity between a first segment of the bit stream and the encoded known address, wherein the encoded known address corresponds to the known device address having been encoded using the forward error correction code, and
a comparator configured to:
determine when the first correlation output is greater than a threshold, wherein the threshold corresponds to a particular degree of similarity with the encoded known address, and
generate a signal that indicates that that the bit stream includes the known device address when the first correlation output is determined to be greater than the threshold;
rate detection circuitry that is configured to determine a particular permissible data rate value, from among a plurality of permissible data rate values, that corresponds to the bit stream wherein the address detection circuitry comprises:
a plurality of second correlators that are configured to correlate the bit stream with respective encoded permissible data rate values to generate respective second correlation outputs, wherein each second correlation output indicates a degree of similarity between a second segment of the bit stream and the respective encoded permissible data rate value, wherein each encoded permissible data rate value corresponds to a respective permissible data rate value that was encoded using the forward error correction code,
wherein the rate detection circuitry is further configured to determine that the bit stream includes one of the permissible data rate values using the plurality of second correlation outputs, and to generate a signal that indicates the one of the permissible data rate values; and
digital processing circuitry configured to process the payload of the packet according to a particular data rate, from among a plurality of permissible data rates, in response to the signal that indicates the one of the permissible data rate values.

7. The communication device of claim 6, wherein:
the forward error correction code is a convolutional error correction code; and
the encoded known address corresponds to the known device address that was encoded using the convolutional error correction code.

8. The communication device of claim 7, wherein:
the convolutional error correction code is a binary convolutional code (BCC); and
the encoded known address corresponds to the known device address that was encoded using the BCC.

9. The communication device of claim 6, wherein the rate detection circuitry further comprises:
a maximum value detection circuit configured to:
determine a maximum correlation value from among the plurality of second correlation outputs, and
generate the signal that indicates the one of the permissible data rate values as corresponding to the maximum correlation value.

10. The communication device of claim 9, wherein:
a first unencoded sequence comprises the known device address appended with the first permissible data rate value;
a first encoded sequence corresponds to the first unencoded sequence having been encoded using the forward error correction code;
the encoded known address corresponds to a first segment of the first encoded sequence;
a first encoded known data rate value, from among the plurality of encoded permissible data rate values, corresponds to a second segment of the first encoded sequence;
a second unencoded sequence comprises the known device address appended with the second permissible data rate value;
a second encoded sequence corresponds to the second unencoded sequence having been encoded using the forward error correction code; and a second encoded permissible data rate value, from among the plurality of encoded permissible data rate values, corresponds to a segment of the second encoded sequence; and the plurality of second correlators includes i) one second correlator configured to correlate the bit stream with the first encoded permissible data rate value to generate one second correlation output among the plurality of second correlation outputs, and ii) another second correlator configured to correlate the bit stream with the second encoded permissible data rate value to generate another second correlation output among the plurality of second correlation outputs.

11. A method for processing a received signal corresponding to a packet, the received signal having been transmitted by a transmitter device, wherein the packet includes a rate indicator field to indicate a data rate at which a payload of the packet was transmitted, and wherein the rate indicator field has been encoded at the transmitter device using a forward error correction code, the method comprising:

generating, at a receiver device, a bit stream corresponding to the received signal at least by demodulating the received signal;

correlating, at the receiver device, the bit stream with a plurality of encoded permissible data rate values to generate a plurality of correlation outputs, wherein each correlation output indicates a degree of similarity between a segment of the bit stream and a respective encoded permissible data rate value, wherein each encoded permissible data rate value corresponds to a respective permissible data rate value that was encoded using the forward error correction code, and wherein each permissible data rate value corresponds to a respective data rate;

determining, at the receiver device, a maximum correlation value from among the plurality of correlation outputs;

determining, at the receiver device, that the bit stream includes a particular permissible data rate value that corresponds to the maximum correlation value from among the plurality of correlation outputs; and in response to determining that the bit stream includes the particular permissible data rate value, processing a payload of the packet according to a particular data rate that corresponds to the particular permissible data rate value.

12. The method of claim 11, wherein:
the forward error correction code is a convolutional error correction code; and
the encoded permissible data rate value corresponds to the permissible data rate value that was encoded using the convolutional error correction code.

13. The method of claim 12, wherein:
the convolutional error correction code is a binary convolutional code (BCC); and
the encoded permissible data rate value corresponds to the permissible data rate value that was encoded using the BCC.

14. The method of claim 11, wherein the plurality of encoded permissible data rate values includes a first encoded permissible data rate value and a second encoded permissible data rate value, wherein the plurality of correlation outputs includes a first correlation output corresponding to the first encoded permissible data rate value and a second correlation output corresponding to the second encoded permissible data rate value, wherein the plurality of permissible data rate values includes a first permissible data rate value and a second permissible data rate value, wherein the first permissible data rate value corresponds to a first data rate, and wherein the second permissible data rate value corresponds to a second data rate;

wherein determining that the bit stream includes the particular permissible data rate value that corresponds to the maximum correlation value comprises:
determining that the bit stream includes the first permissible data rate value when the first correlation output is determined to be the maximum correlation value, and
determining that the bit stream includes the second permissible data rate value when the second correlation output is determined to be the maximum correlation value; and wherein the method further comprises:
in response to determining that the bit stream includes the first permissible data rate value, processing the payload of the packet according to the first data rate, and
in response to determining that the bit stream includes the second permissible data rate value, processing the payload of the packet according to the second data rate.

15. The method of claim 14, wherein determining the maximum correlation value from among the plurality of second correlation outputs comprises determining whether the first correlation output is greater than the second correlation output; and wherein determining that the bit stream includes the particular permissible data rate value that corresponds to the maximum correlation value comprises:
determining that the bit stream includes the first permissible data rate value when the first correlation output is greater than the second correlation output, and
determining that the bit stream includes the second permissible data rate value when the first correlation output is less than the second correlation output.

16. A communication device, comprising:
receiver circuitry configured to generate a bit stream corresponding to a received signal, the received signal having been transmitted by a transmitter device, wherein the circuitry includes a demodulator configured to demodulate the received signal, wherein the received signal corresponds to a packet, wherein the packet includes a rate indicator field to indicate a data rate at which a payload of the packet was transmitted, and wherein the rate indicator field has been encoded at the transmitter device using a forward error correction code;

rate detection circuitry that is configured to determine whether the bit stream includes a permissible data rate value, wherein the permissible data rate value corresponds to a particular data rate, and wherein the rate detection circuitry comprises:
a plurality of correlators configured to correlate the bit stream with a plurality of encoded permissible data rate values to generate a plurality of correlation outputs, wherein each correlation output indicates a respective degree of similarity between a segment of the bit stream and a respective encoded permissible data rate value, wherein each encoded permissible data rate value corresponds to a respective permissible data rate value that was encoded using the forward error correction code, and
a maximum value detector configured to:

determine a maximum correlation value from among the plurality of correlation outputs, and generate a signal that indicates that that the bit stream includes a particular permissible rate that corresponds to the maximum correlation value; and digital processing circuitry configured to process the payload of the packet according to the particular permissible data rate in response to the signal that indicates that that the bit stream includes the particular permissible rate.

17. The communication device of claim 16, wherein:
the forward error correction code is a convolutional error correction code; and
the encoded permissible data rate value corresponds to the permissible data rate value that was encoded using the convolutional error correction code.

18. The communication device of claim 17, wherein:
the convolutional error correction code is a binary convolutional code (BCC); and
the encoded permissible data rate value corresponds to the permissible data rate value that was encoded using the BCC.

19. The communication device of claim 16, wherein the plurality of encoded permissible data rate values includes a first encoded permissible data rate value and a second encoded permissible data rate value, wherein the plurality of permissible data rate values includes a first permissible data rate value and a second permissible data rate value, wherein the first permissible data rate value corresponds to a first data rate, and wherein the second permissible data rate value corresponds to a second data rate;

wherein the plurality correlators includes:
a first correlator configured to correlate the bit stream with the first encoded permissible data rate value to generate a first correlation output that indicates a degree of similarity between the segment of the bit stream and the first encoded permissible data rate value, and a second correlator configured to correlate the bit stream with the second encoded permissible data rate value to generate a second correlation output that indicates a degree of similarity between the segment of the bit stream and the second encoded permissible data rate value;

wherein the maximum value detector is configured to:
generate the signal to indicate that the bit stream includes the first permissible data rate value when the first correlation output is determined to be the maximum correlation value, and generate the signal to indicate that the bit stream includes the second permissible data rate value when the second correlation output is determined to be the maximum correlation value; and wherein the digital processing circuitry configured to:
in response to determining that the bit stream includes the first permissible data rate value, process the payload of the packet according to the first data rate, and in response to determining that the bit stream includes the second permissible data rate value, process the payload of the packet according to the second data rate.

20. The communication device of claim 19, wherein the maximum value detector is configured to:
determine whether the first correlation output is greater than the second correlation output;
generate the signal to indicate that the bit stream includes the first permissible data rate value when the first correlation output is greater than the second correlation output; and
generate the signal to indicate that the bit stream includes the second permissible data rate value when the first correlation output is less than the second correlation output.

* * * * *